United States Patent
Sugino et al.

(10) Patent No.: US 8,269,332 B2
(45) Date of Patent: Sep. 18, 2012

(54) SEMICONDUCTOR ELEMENT MOUNTING BOARD

(75) Inventors: Mitsuo Sugino, Utsunomiya (JP); Hideki Hara, Utsunomiya (JP); Toru Meura, Utsunomiya (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 166 days.

(21) Appl. No.: 12/682,649

(22) PCT Filed: Oct. 15, 2008

(86) PCT No.: PCT/JP2008/068609
§ 371 (c)(1),
(2), (4) Date: Apr. 12, 2010

(87) PCT Pub. No.: WO2009/051120
PCT Pub. Date: Apr. 23, 2009

(65) Prior Publication Data
US 2010/0213597 A1    Aug. 26, 2010

(30) Foreign Application Priority Data

Oct. 16, 2007   (JP) .................................. 2007-269569
Oct. 10, 2008   (JP) .................................. 2008-263591

(51) Int. Cl.
*H01L 23/48*   (2006.01)
(52) U.S. Cl. .................. 257/690; 257/702; 257/E23.01; 257/E23.124; 257/E23.125
(58) Field of Classification Search .................. 257/790, 257/700–703, 783, E23.01, E23.023, 690, 257/E23.124–E23.126
See application file for complete search history.

(56) References Cited

U.S. PATENT DOCUMENTS
7,414,309 B2 *   8/2008   Oi et al. .................. 257/700
(Continued)

FOREIGN PATENT DOCUMENTS
JP    7-297560    11/1995
(Continued)

OTHER PUBLICATIONS
International Search Report for International Application No. PCT/JP2008/068609 mailed Jan. 20, 2009.

*Primary Examiner* — Jasmine Clark
(74) *Attorney, Agent, or Firm* — Smith, Gambrell & Russell, LLP

(57) ABSTRACT

A semiconductor element mounting board includes: aboard having surfaces; a semiconductor element mounted on one of the surfaces of the board; a first layer into which the semiconductor element is embedded, the first layer being provided on the one surface of the board; a second layer provided on the other surface of the board, the second layer being constituted from the same material as that of the first layer, the constituent material of the second layer having the same composition ratio as that of the constituent material of the first layer; and surface layers provided on the first and second layers, respectively, each of the surface layers being formed from at least a single layer. In such a semiconductor element mounting board, each of the surface layers has rigidity higher than that of each of the first and second layers. It is preferred that in the case where a Young's modulus of each surface layer at 25° C. is defined as X GPa and a Young's modulus of the first layer at 25° C. is defined as Y GPa, the X and the Y satisfy a relation of $0.5 \leq X-Y \leq 13$.

16 Claims, 2 Drawing Sheets

U.S. PATENT DOCUMENTS

| | | |
|---|---|---|
| 2002/0108776 A1 | 8/2002 | Uchikawa et al. |
| 2007/0119619 A1 | 5/2007 | Nakamura et al. |
| 2007/0141759 A1 | 6/2007 | Nagase et al. |

FOREIGN PATENT DOCUMENTS

| | | |
|---|---|---|
| JP | 2002-093957 | 3/2002 |
| JP | 2002-246760 | 8/2002 |
| JP | 2004-343021 | 12/2004 |
| JP | 2005-236039 | 9/2005 |
| JP | 2007-043184 | 2/2007 |
| JP | 2007-096260 | 4/2007 |
| JP | 2007-173276 | 7/2007 |

* cited by examiner

SEMICONDUCTOR ELEMENT MOUNTING BOARD

TECHNICAL FIELD

The present invention relates to a semiconductor element mounting board.

BACKGROUND ART

An electronic device includes a board on which semiconductor elements such as IC chips and capacitors are mounted.

Recently, an electronic device is downsized or high-functionalized, and therefore the number of the semiconductor elements to be mounted on a single board increases. This causes a problem that a sufficient mounting area of the semiconductor elements cannot be secured.

In order to solve such a problem, an attempt is made to secure a mounting area of semiconductor elements by embedding them into a semiconductor element mounting board (multilayer wiring board) so that an electronic device can be downsized (see, for example, patent document 1).

However, in the semiconductor element mounting board into which semiconductor elements are embedded, structures of upper and lower sides thereof become unsymmetric, and physical properties thereof also become unsymmetric. Because of this, there is a problem in that warpage is likely to occur in the board, so that reliability of the semiconductor element mounting board is lowered.

Patent document 1: JP-A-2005-236039

DISCLOSURE OF THE INVENTION

An object of the present invention is to provide a semiconductor element mounting board which can prevent occurrence of warpage thereof due to change of an external environment and prevent delamination of semiconductor elements mounted on a board.

In order to achieve such an object, the present invention includes the following features (1) to (17).

(1) A semiconductor element mounting board, comprising:
a board having surfaces;
a semiconductor element mounted on one of the surfaces of the board;
a first layer into which the semiconductor element is embedded, the first layer being provided on the one surface of the board;
a second layer provided on the other surface of the board, the second layer being constituted from the same material as that of the first layer, the constituent material of the second layer having the same composition ratio as that of the constituent material of the first layer; and
surface layers provided on the first and second layers, respectively, each of the surface layers being formed from at least a single layer,
wherein each of the surface layers has rigidity higher than that of each of the first and second layers.

(2) The semiconductor element mounting board according to the above feature (1), wherein in the case where a Young's modulus of each surface layer at 25° C. is defined as X GPa and a Young's modulus of the first layer at 25° C. is defined as Y GPa, the X and the Y satisfy a relation of $0.5 \leq X-Y \leq 13$.

(3) The semiconductor element mounting board according to the above feature (2), wherein the Young's modulus of the surface layer at 25° C. is in the range of 4 to 15 GPa.

(4) The semiconductor element mounting board according to the above feature (2), wherein the Young's modulus of the first layer at 25° C. is in the range of 2 to 10 GPa.

(5) The semiconductor element mounting board according to the above feature (1), wherein in the case where a coefficient of thermal expansion of the surface layer in an inplane direction thereof measured based on JIS C 6481 at a temperature of 20° C. to a glass-transition temperature $Tg_a$° C. thereof, which is measured based on JIS C 6481, is defined as A ppm/° C. and a coefficient of thermal expansion of the first layer in an inplane direction thereof measured based on JIS C 6481 at a temperature of 20° C. to a glass-transition temperature $Tg_b$° C. thereof, which is measured based on JIS C 6481, is defined as B ppm/° C., the A and the B satisfy a relation of $0.5 \leq B-A \leq 50$.

(6) The semiconductor element mounting board according to the above feature (5), wherein the coefficient of thermal expansion of the surface layer in the inplane direction thereof measured based on JIS C 6481 at the temperature of 20° C. to the glass-transition temperature $Tg_a$° C., which is measured based on JIS C 6481, is 40 ppm/° C. or lower.

(7) The semiconductor element mounting board according to the above feature (5), wherein the coefficient of thermal expansion of the first layer in the inplane direction thereof measured based on JIS C 6481 at the temperature of 20° C. to the glass-transition temperature $Tg_b$° C., which is measured based on JIS C 6481, is in the range of 25 to 50 ppm/° C.

(8) The semiconductor element mounting board according to the above feature (1), wherein a glass-transition temperature $Tg_a$ of the surface layer, which is measured based on JIS C 6481, is in the range of 100 to 300° C.

(9) The semiconductor element mounting board according to the above feature (1), wherein a glass-transition temperature $Tg_b$ of the first layer, which is measured based on JIS C 6481, is in the range of 100 to 250° C.

(10) The semiconductor element mounting board according to the above feature (1), wherein a Young's modulus of the board at 25° C. is in the range of 20 to 50 GPa.

(11) The semiconductor element mounting board according to the above feature (1), wherein a coefficient of thermal expansion of the board in an inplane direction thereof measured based on JIS C 6481 at a temperature of 20° C. to a glass-transition temperature $Tg_c$° C. thereof, which is measured based on JIS C 6481, is 13 ppm/° C. or lower.

(12) The semiconductor element mounting board according to the above feature (1), wherein the semiconductor element is mounted on the board through a film.

(13) The semiconductor element mounting board according to the above feature (1), wherein the surface layer is mainly composed of a resin material containing cyanate resin and an inorganic filler.

(14) The semiconductor element mounting board according to the above feature (13), wherein an amount of the resin material contained in the surface layer is in the range of 30 to 70 wt %.

(15) The semiconductor element mounting board according to the above feature (13), wherein an amount of the inorganic filler contained in the surface layer is in the range of 5 to 40 wt %.

(16) The semiconductor element mounting board according to the above feature (13), wherein the resin material further contains epoxy resin, and
wherein in the case where an amount of the cyanate resin contained in the resin material is defined as C wt % and an amount of the epoxy resin contained in the resin material is defined as D wt %, the C and the D satisfy a relation of $0.5 \leq D/C \leq 4$.

(17) The semiconductor element mounting board according to the above feature (13), wherein the resin material further contains phenoxy resin, and wherein in the case where an amount of the cyanate resin contained in the resin material is defined as C wt % and an amount of the phenoxy resin contained in the resin material is defined as E wt %, the C and the E satisfy a relation of $0.2 \leq E/C \leq 2$.

BEST MODE FOR CARRYING OUT THE INVENTION

Hereinbelow, description will be made on a preferred embodiment of a semiconductor element mounting board according to the present invention.

Figure 1:
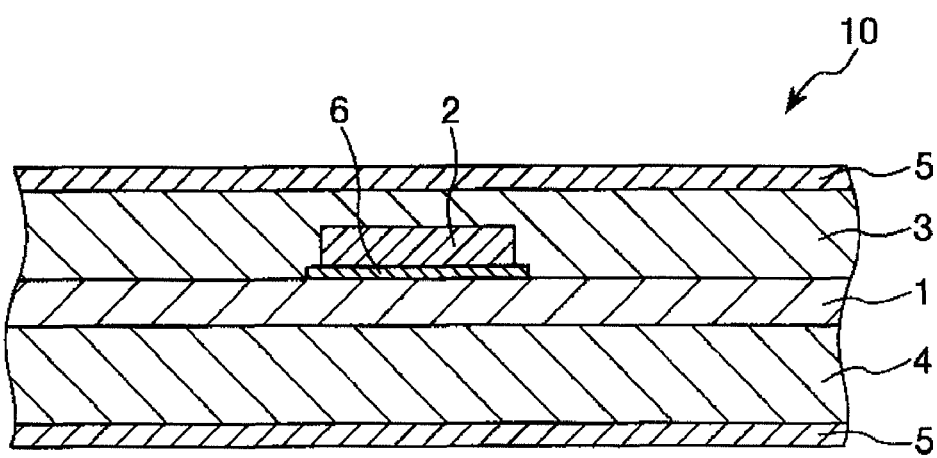
FIG. 1 is a longitudinal section showing a preferred embodiment of a semiconductor element mounting board according to the present invention.

FIG. 1 is a longitudinal section showing a preferred embodiment of the semiconductor element mounting board according to the present invention. In this regard, it is to be noted that hereinbelow, an upper side of FIG. 1 is referred to as "upper" or "upper side".

As shown in FIG. 1, the semiconductor element mounting board 10 includes a core board (substrate) 1, semiconductor element 2 mounted on an upper surface of the core board 1, a first layer 3 formed so as to embed the semiconductor element 2 thereinto and provided on the upper surface (one surface) of the core board 1, a second layer 4 provided on a lower surface (the other surface) of the core board 1, and surface layers 5, respectively, provided on the first layer 3 and the second layer 4.

Further, wiring circuits each having a predetermined pattern (which are not shown in FIG. 1) are formed on the core board 1, the first layer 3, the second layer 4 and the surface layers 5, respectively, and electrically connected to each other. Furthermore, the semiconductor element 2 is electrically connected to the wiring circuit provided on the surface layers 5.

The core board 1 has a function of supporting the semiconductor element 2 mounted thereon.

Further, the core board 1 is composed of a material having a high dielectric property and high rigidity (Young's modulus).

Although the core board 1 may be composed of any materials each having the above properties, it is preferred that the core board 1 is mainly composed of a fiber base member, a resin material and an inorganic filler.

Examples of the fiber base member include: a glass fiber base member made of glass fibers such as a glass woven cloth or a glass non-woven cloth; a synthetic fiber base member formed from a woven or non-woven cloth mainly made of polyamide-based resin fibers (e.g., polyamide resin fibers, aromatic polyamide resin fibers and wholly aromatic polyamide resin fibers), polyester-based resin fibers (e.g., polyester resin fibers, aromatic polyester resin fibers and wholly aromatic polyester resin fibers), polyimide resin fibers or fluorocarbon resin fibers; a paper base member mainly formed from kraft paper, cotton linter paper or blended paper of linter and kraft pulp; and the like.

Among these fiber base members, the glass fiber base member is preferably used. By using such a glass fiber base member, it is possible to improve rigidity of the core board 1 and to reduce a thickness of the core board 1. In addition, it is also possible to lower a coefficient of thermal expansion of the core board 1.

This makes it possible to reduce occurrence of warpage of the semiconductor element mounting board 10 more effectively. As a result, it is possible to reduce stress which would be applied to the semiconductor element 2 mounted on (embedded into) the element mounting board 10, thereby preventing occurrence of defects in the mounted semiconductor element 2.

Examples of glass for forming the glass fiber base member include E glass, C glass, A glass, S glass, D glass, NE glass, T glass, H glass, and the like. Among these glasses, the T glass is preferably used. By using such a T glass, it is possible to lower a coefficient of thermal expansion of the glass fiber base member. This makes it possible to lower the coefficient of thermal expansion of the core board 1.

Further, an amount (ratio) of the fiber base member contained in the core board 1 is preferably in the range of 30 to 70 wt %, and more preferably in the range of 40 to 60 wt %. This makes it possible to lower the coefficient of thermal expansion of the core board 1 more effectively.

A resin material constituting the core board 1 is not limited to a specific one, as long as it has a dielectric property. For example, as the resin material constituting the core board 1, the same one as a resin material constituting the surface layer 5 described below or the like is preferably used. This makes it possible to lower the coefficient of thermal expansion of the core board 1 more effectively.

An amount of the resin material contained in the core board 1 is preferably in the range of 15 to 40 wt %, and more preferably in the range of 20 to 35 wt %. This makes it possible to make rigidity of the core board 1 high more effectively.

Further, examples of the inorganic filler include talc, alumina, glass, silica, mica, aluminum hydroxide, magnesium hydroxide, and the like.

An amount of the inorganic filler contained in the core board 1 is preferably in the range of 12 to 35 wt %, and more preferably in the range of 18 to 30 wt %. This makes it possible to make rigidity of the core board 1 high more effectively.

A Young's modulus of the core board 1 at 25° C. is preferably in the range of 20 to 50 GPa, and more preferably in the range of 25 to 40 GPa. This makes it possible to reduce occurrence of warpage of the semiconductor element mounting board 10 more effectively.

A Young's modulus of the core board 1 at 250° C. is preferably in the range of 10 to 45 GPa, and more preferably in the range of 13 to 35 GPa. By setting the Young's modulus to a value within the above range, the core board 1 can exhibit excellent rigidity when being heated. This makes it possible to reduce occurrence of warpage of the semiconductor element mounting board 10 more reliably, thereby improving reliability thereof.

A coefficient of thermal expansion of the core board 1 in an inplane direction thereof measured based on JIS C 6481 at a temperature of 20° C. to a glass-transition temperature $Tg_c$° C. thereof, which is measured based on JIS C 6481, is preferably 13 ppm/° C. or lower, and more preferably in the range of 3 to 11 ppm/° C. This makes it possible to reduce occurrence of warpage of the semiconductor element mounting board 10 further effectively, thereby reducing stress which would occur therein.

An average thickness of the core board 1 is preferably in the range of 25 to 800 µm, and more preferably in the range of 40 to 200 µm.

As shown in FIG. 1, the semiconductor element 2 is bonded to the core board 1 through the bonding film 6.

Examples of the semiconductor element 2 include an IC chip, a capacitor, a diode, a transistor, a thyristor and the like.

The bonding film 6 is a flexible member mainly composed of an adhesive agent. By bonding the semiconductor element 2 to the core board 1 through such a bonding film 6, the following effect can be obtained. Namely, there is a case that a size of the first layer 3 described below or the like is changed due to variation of an external environment (usage environment) in temperature, humidity or the like so that external force is imparted to the semiconductor element 2. Even in this case, it is possible to reduce the impartation of such external force to the semiconductor element 2 due to existence of the above bonding film 6.

This makes it possible to prevent occurrence of defectives such as delamination of the semiconductor element 2 from the core board 1 and breakage of the semiconductor element 2 more effectively.

Examples of the adhesive agent constituting the bonding film 6 include epoxy resin, silicone resin, polyimide resin, acryl resin, polyester resin and the like. As the bonding film 6, a film to which a conductive property is imparted by adding conductive particles thereinto may be used. Further, the above adhesive agents may be used in the form of liquid.

A coefficient of thermal expansion of the bonding film 6 in an inplane direction thereof measured based on JIS C 6481 at a temperature of 20° C. to a glass-transition temperature $Tg_a°$ C. thereof, which is measured based on JIS C 6481, is preferably in the range of 30 to 300 ppm/° C., and more preferably in the range of 500 to 160 ppm/° C.

By setting the coefficient of thermal expansion to a value within the above range, a shape of the bonding layer 6 can be changed depending on dimensional change of the semiconductor element 2 more reliably. As a result, it is possible to prevent undesirable delamination of the semiconductor element 2 from the core board 1 more reliably.

A Young's modulus of the bonding film 6 at 25° C. is preferably in the range of about 5 to 900 MPa, and more preferably in the range of about 10 to 400 MPa. By setting the Young's modulus to a value within the above range, a shape of the bonding layer 6 can be changed depending on dimensional change of the semiconductor element 2 more reliably. As a result, it is possible to prevent undesirable delamination of the semiconductor element 2 from the core board 1 more reliably.

As shown in FIG. 1, the first layer 3 formed so as to embed the above-mentioned semiconductor element 2 thereinto and the second layer 4 are provided on both surfaces of the core board 1.

The first layer 3 and the second layer 4 are formed of materials containing the same components in the same ratios. As a result, they have equal physical properties (e.g. coefficients of thermal expansion, Young's moduluses). Further, the first layer 3 and the second layer 4 are composed of materials having high dielectric properties. The constituent materials of the first layer 3 and the second layer 4 will be described in detail below.

One surface layer 5 is formed on the first layer 3 and the other surface layer 5 is formed below the second layer 4.

The present invention is characterized in that each of the surface layers 5 has rigidity higher than that of each of the first layer 3 and the second layer 4. By providing such surface layers 5 each having relatively high rigidity, it is possible to reduce dimensional changes of other layers (e.g. first layer 3, second layer 4) which would occur depending on change of an external environment such as outside air temperature or outside air humidity. As a result, it is possible to prevent occurrence of warpage of the semiconductor element mounting board 10.

Further, since the first layer 3 into which the semiconductor element 2 is embedded is formed of a material having relatively flexibility, even in the case where the dimensional change of the first layer 3 occurs depending on the change of the external environment, it is possible to reduce an effect of such change on the semiconductor element 2. As a result, it is possible to prevent undesirable delamination of the semiconductor element 2 from the core board 1.

Further, the first layer 3 and the second layer 4 can absorb force which would occur when the semiconductor element mounting board 10 warps as whole. This also makes it possible to reduce occurrence of warpage of the semiconductor element mounting board 10. In addition, since the first layer 3 and the second layer 4 have the same physical properties, it is possible to make warpage of the semiconductor element mounting board 10 which would occur depending on the change of the external environment smaller.

As described above, each surface layer 5 has the rigidity higher than that of the first layer 3 (second layer 4). Specifically, in the case where a Young's modulus of the surface layer 5 at 25° C. is defined as X GPa and a Young's modulus of the first layer 3 at 25° C. is defined as Y GPa, the X and the Y preferably satisfy a relation of $0.5 \leq X-Y \leq 13$, and more preferably satisfy a relation of $3 \leq X-Y \leq 8$. This makes it possible to further improve the effects of the present invention as described above.

The Young's modulus of the surface layer 5 at 25° C. is preferably in the range of 4 to 20 GPa, and more preferably in the range of 5 to 15 GPa. This makes it possible to reduce occurrence of warpage of the semiconductor element mounting board 10 more effectively.

Further, the Young's modulus of the first layer 3 (second layer 4) at 25° C. is preferably in the range of 2 to 10 GPa, and more preferably in the range of 3 to 7 GPa. This makes it possible to prevent undesirable delamination of the semiconductor element 2 from the core board 1 more effectively.

In the case where a coefficient of thermal expansion of the surface layer 5 in an inplane direction thereof measured based on JIS C 6481 at a temperature of 20° C. to a glass-transition temperature $Tg_a°$ C. thereof, which is measured based on JIS C 6481, is defined as A ppm/° C. and a coefficient of thermal expansion of the first layer 3 (second layer 4) in an inplane direction thereof measured based on JIS C 6481 at a temperature of 20° C. to a glass-transition temperature $Tg_b°$ C. thereof, which is measured based on JIS C 6481, is defined as B ppm/° C., the A and the B preferably satisfy a relation of $0.5 \leq B-A \leq 50$, and more preferably satisfy a relation of $5 \leq B-A \leq 40$.

By setting the A and the B to such a relation, it is possible to prevent delamination of the semiconductor element 2 from the core board 1 more reliably and to reduce occurrence of warpage of the semiconductor element mounting board 10 more reliably.

The coefficient of thermal expansion of the surface layer 5 in the inplane direction thereof measured based on JIS C 6481 at the temperature of 20° C. to the glass-transition temperature $Tg_a°$ C. thereof, which is measured based on JIS C 6481, is preferably 40 ppm/° C. or lower, and more preferably in the range of 3 to 30 ppm/° C.

This makes it possible to prevent delamination of the semiconductor element 2 from the core board 1 more effectively and to reduce occurrence of warpage of the semiconductor element mounting board 10 more effectively.

The coefficient of thermal expansion of the first layer 3 (second layer 4) in the inplane direction thereof measured based on JIS C 6481 at the temperature of 20° C. to the glass-transition temperature $Tg_b°$ C. thereof, which is measured based on JIS C 6481, is preferably in the range of 25 to 50 ppm/° C., and more preferably in the range of 30 to 46 ppm/° C.

This makes it possible to prevent delamination of the semiconductor element 2 from the core board 1 more effectively and to reduce occurrence of warpage of the semiconductor element mounting board 10 more effectively.

The glass-transition temperature $Tg_a$ of the surface layer 5, which is measured based on JIS C 6481, is preferably in the range of 190 to 300° C., and more preferably in the range of 230 to 280° C. This makes it possible to reduce occurrence of warpage of the semiconductor element mounting board 10 and to make heat resistance of the semiconductor element mounting board 10 higher.

Further, the glass-transition temperature $Tg_b$ of the first layer 3 (second layer 4), which is measured based on JIS C 6481, is preferably in the range of 190 to 300° C., and more preferably in the range of 230 to 280° C. This makes it possible to reduce occurrence of warpage of the semiconductor element mounting board 10 and to make heat resistance of the semiconductor element mounting board 10 higher.

An average thickness of the first layer 3 (second layer 4) is preferably in the range of 30 to 800 μm, and more preferably in the range of 50 to 200 μm.

Although a resin material constituting the surface layer 5 is not limited to a specific one, but preferably contains, for example, a thermosetting resin. This makes it possible to improve heat resistance of the surface layer 5.

Examples of the thermosetting resin include: phenolic resin such as novolak type phenolic resin (e.g., phenol novolak resin, cresol novolak resin, bisphenol A novolak resin), or resol type phenolic resin (e.g., non-modified resol phenolic resin, oil-modified resol phenolic resin modified with oil such as wood oil, linseed oil or walnut oil); epoxy resin such as bisphenol type epoxy resin (e.g., bisphenol A epoxy resin, bisphenol F epoxy resin), novolak type epoxy resin (e.g., novolak epoxy resin, cresol novolak epoxy resin), or biphenyl type epoxy resin; urea resin; triazine ring-containing resin such as melamine resin; unsaturated polyester resin; bismaleimide resin; polyurethane resin; diallylphthalate resin; silicone resin; benzoxazine ring-containing resin; cyanate resin; and the like.

Among these thermosetting resins, the cyanate resin is more preferably used. By using such cyanate resin, it is possible to lower the coefficient of thermal expansion of the surface layer 5. In addition, it is also possible to improve the heat resistance of the surface layer 5.

The cyanate resin can be obtained by, for example, thermally curing a prepolymer produced using a method of reacting cyanogen halide and phenol with each other, and then optionally heating them. Specifically, examples of such cyanate resin include novolak type cyanate resin, bisphenol type cyanate resin such as bisphenol A type cyanate resin, bisphenol E type cyanate resin or tetramethyl bisphenol F type cyanate resin, and the like.

Among these cyanate resins, the novolak type cyanate resin is preferably used. By using the novolak type cyanate resin, it is possible to further improve the heat resistance and flammability of the surface layer 5 due to increase of a crosslinking density of the resin material in the surface layer 5. This is because the novolak type cyanate resin has triazine rings and because it has a high content of benzene rings due to its structure, thereby easily carbonizing the benzene rings contained therein.

In addition, by using the novolak type cyanate resin, it is also possible to impart excellent rigidity to the surface layer 5, even in the case where the surface layer 5 has a reduced thickness (e.g., 35 μm or less). The surface layer 5 offers excellent rigidity particularly upon heating, and therefore the surface layer 5 makes it possible to reduce occurrence of warpage of the semiconductor element mounting board 10 more reliably and to improve reliability of the semiconductor element mounting board 10.

As the prepolymer of the novolak type cyanate resin, one represented by, for example, the following formula (I) can be used.

[Formula 1]

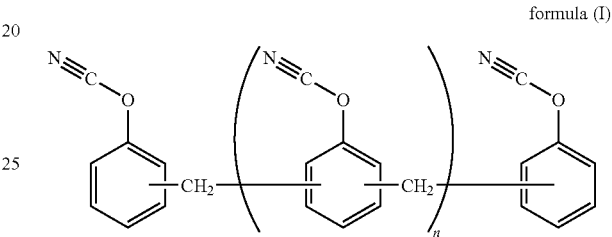

formula (I)

wherein "n" is any integer.

An average number of repeating units "n" of the prepolymer of the novolak type cyanate resin represented by the above formula (I) is not limited to a specific value, but is preferably in the range of 1 to 10, and more preferably in the range of 2 to 7.

If the average number of the repeating units "n" is less than the above lower limit value, the novolak type cyanate resin tends to be crystallized, thereby relatively lowering solubility of the novolak type cyanate resin in common solvents. As a result, there is a case that it is difficult to handle the novolak type cyanate resin.

On the other hand, if the average number of the repeating units "n" exceeds the above upper limit value, a melt viscosity of the resin material becomes too high, and therefore there is a case that forming efficiency (moldability) of the surface layer 5 is lowered.

A weight-average molecular weight of the prepolymer of the cyanate resin is not limited to a specific value, but is preferably in the range of 500 to 4,500, and more preferably in the range of 600 to 3,000.

In this regard, it is to be noted that the weight-average molecular weight of a resin, a prepolymer or the like can be measured using, for example, a GPC (gel permeation chromatography).

The GPC measurement is carried out by, for example, using HLC-8200GPC (produced by TOSOH CORPORATION) as measurement equipment, TSK=GEL polystyrene as a column and THF (tetrahydrofuran) as a solvent.

An amount of the cyanate resin contained in the surface layer 5 is not limited to a specific value, but is preferably in the range of 1 to 20 wt %, and more preferably in the range of 3 to 15 wt %. If the amount of the cyanate resin is less than the above lower limit value, there is a case that it becomes difficult to form the surface layer 5. On the other hand, if the amount of the cyanate resin exceeds the above upper limit value, there is a case that mechanical strength of the surface layer 5 is lowered.

Further, in the case where the cyanate resin (especially, novolak type cyanate resin) is used as the thermosetting resin, an epoxy resin containing substantially no halogen atom is preferably used in combination with the cyanate resin.

Examples of the epoxy resin include phenol novolak type epoxy resin, bisphenol type epoxy resin, naphthalene type epoxy resin, aryl alkylene type epoxy resin, and the like. Among these epoxy resins, the aryl alkylene type epoxy resin is preferably used. By using such an aryl alkylene type epoxy resin, it is possible to further improve thermal resistance of moisture absorbed solder and flammability of the surface layer 5.

The aryl alkylene type epoxy resin is an epoxy resin having one or more aryl alkylene groups in one repeating unit. Examples of such an aryl alkylene type epoxy resin include xylylene type epoxy resin, biphenyl dimethylene type epoxy resin, and the like. Among these aryl alkylene type epoxy resins, the biphenyl dimethylene type epoxy resin is preferably used. A prepolymer of the biphenyl dimethylene type epoxy resin can be represented by, for example, the following formula (II).

[Formula 2]

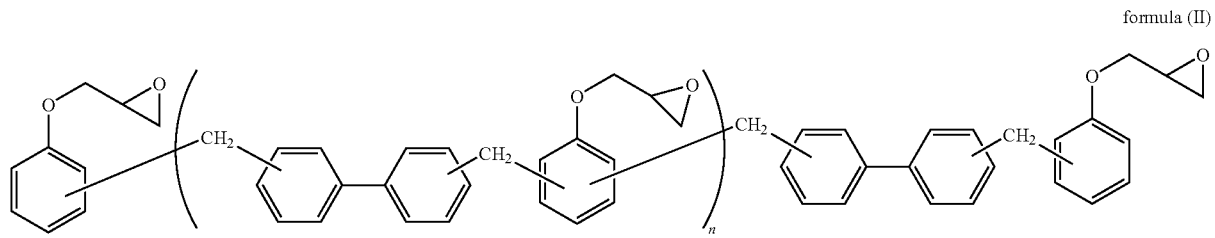

formula (II)

wherein "n" is any integer.

An average number of repeating units "n" of the prepolymer of the biphenyl dimethylene type epoxy resin represented by the above formula (II) is not limited to a specific value, but is preferably in the range of 1 to 10, and more preferably in the range of 2 to 5.

If the average number of the repeating units "n" is less than the above lower limit value, the biphenyl dimethylene type epoxy resin tends to be crystallized, thereby lowering solubility of the biphenyl dimethylene type epoxy resin in common solvents. As a result, there is a case that it becomes difficult to handle the biphenyl dimethylene type epoxy resin.

On the other hand, if the average number of the repeating units "n" exceeds the above upper limit value, there is a case that flowability of the resin material is lowered, thereby causing defective molding of the surface layer 5 and the like.

An amount of the cyanate resin contained in the resin material is defined as C wt % and an amount of the epoxy resin contained in the resin material is defined as D wt %, the C and the D preferably satisfy a relation of $0.5 \leqq D/C \leqq 4$, and more satisfy a relation of $1 \leqq D/C \leqq 3$. This makes it possible to improve the heat resistance of the surface layer 5 and to make the coefficient of thermal expansion of the surface layer 5 especially lower.

The amount of the epoxy resin contained in the surface layer 5 is not limited to a specific value, but is preferably in the range of 3 to 25 wt %, and more preferably in the range of 5 to 20 wt %. If the amount of the epoxy resin is less than the above lower limit value, there is a case that reactivity of the prepolymer of the cyanate resin and water absorption of the surface layer 5 (obtained product) are lowered. On the other hand, if the amount of the epoxy resin exceeds the above upper limit value, there is a case that heat resistance of the surface layer 5 is lowered.

A weight-average molecular weight of the prepolymer of the epoxy resin is not limited to a specific value, but is preferably in the range of 500 to 20,000, and more preferably in the range of 800 to 15,000.

Further, in the case where the cyanate resin (especially, novolak type cyanate resin) is used as the thermosetting resin, a phenoxy resin containing substantially no halogen atom is preferably used in combination with the cyanate resin. This makes it possible to improve forming efficiency (moldability) of the surface layer 5. In this regard, "substantially no halogen atom" means that an amount of halogen atoms contained in the phenoxy resin is 1 wt % or less.

Examples of the phenoxy resin include, but are not limited to, phenoxy resin having bisphenol chemical structures, phenoxy resin having novolak chemical structures, phenoxy resin having naphthalene chemical structures, phenoxy resin having biphenyl chemical structures, and the like. Alternatively, phenoxy resin having two or more kinds of these chemical structures may also be used.

Among these phenoxy resins, phenoxy resin having biphenyl chemical structures and bisphenol S chemical structures can be preferably used. Such phenoxy resin has a high glass-transition temperature due to rigidity resulting from the biphenyl chemical structures and has improved adhesiveness to a plating metal when manufacturing a multilayer printed wiring board due to existence of the bisphenol S chemical structures.

Further, phenoxy resin having bisphenol A chemical structures and bisphenol F chemical structures can be also used. This makes it possible to improve adhesiveness of the surface layer 5 to an inner circuit layer when manufacturing a multilayer printed wiring board.

Furthermore, the phenoxy resin having biphenyl chemical structures and bisphenol S chemical structures and the phenoxy resin having bisphenol A chemical structures and bisphenol F chemical structures can be used in combination. This makes it possible to allow the surface layer 5 to have properties resulting from these phenoxy resins in a fine balance.

In the case where the phenoxy resin (1) having bisphenol A chemical structures and bisphenol F chemical structures and the phenoxy resin (2) having biphenyl chemical structures and bisphenol S chemical structures are used in combination, a combined ratio between (1) and (2) is not limited to a specific value, but can be set to a range of, for example, 2:8 to 9:1.

A molecular weight of the phenoxy resin is not limited to a specific value, but a weight-average molecular weight of the phenoxy resin is preferably in the range of 5,000 to 50,000, and more preferably in the range of 10,000 to 40,000.

If the weight-average molecular weight is less than the above lower limit value, there is a case that an effect of improving film-formability to the resin material is lowered. On the other hand, if the weight-average molecular weight of the phenoxy resin exceeds the above upper limit value, there is a case that solubility of the phenoxy resin is lowered.

An amount of the phenoxy resin contained in the surface layer 5 is not limited to a specific value, but is preferably in the range of 1 to 30 wt %, and more preferably in the range of 3 to 20 wt %.

If the amount of the phenoxy resin contained in the surface layer 5 is less than the above lower limit value, there is a case that an effect of improving film-formability of the surface layer 5 is lowered. On the other hand, if the amount of the phenoxy resin contained in the surface layer 5 exceeds the above upper limit value, there is a case that an effect of imparting a low-thermal expansion property to the surface layer 5 is lowered.

In the case where the amount of the cyanate resin contained in the resin material is defined as C wt % and the amount of the phenoxy resin contained in the resin material is defined as E wt %, the C and the E satisfy preferably a relation of $0.2 \leq E/C \leq 2$, and more preferably a relation of $0.3 \leq E/C \leq 1.5$. This makes it possible to improve the film-formability of the surface layer 5 and to more lower a coefficient of thermal expansion of the surface layer 5.

Furthermore, use of the cyanate resin (especially, novolak type cyanate resin), the phenoxy resin (especially, phenoxy resin biphenyl chemical structures or bisphenol S chemical structures) and the epoxy resin (especially, aryl alkylene type epoxy resin, and more especially, biphenyl dimethylene type epoxy resin) in combination makes it possible for the surface layer 5 to exhibit the effects of the present invention more remarkably.

In this regard, it is to be noted that the resin material constituting the surface layer 5 may contain a thermoplastic resin such as phenolic resin, polyimide resin, polyamideimide resin, polyphenylene oxide resin or polyethersulfone resin in addition to the above mentioned resins.

An amount of the above resin material contained in the surface layer 5 is preferably in the range of 30 to 70 wt %, and more preferably in the range of 40 to 60 wt %. This makes it possible to improve the heat resistance of the surface layer 5 and to lower the coefficient of thermal expansion of the surface layer 5.

Further, it is preferred that the surface layer 5 contains an inorganic filler. This makes it possible to obtain a surface layer 5 having high mechanical strength even in the case where it is formed so as to have a thin thickness (e.g., 35 μm or less). This also allows the surface layer 5 to have a low-thermal expansion property reliably.

As the inorganic filler, the same one as described in the core board 1 can be used. Among the above mentioned inorganic fillers, the silica is preferably used. From the viewpoint of excellent low-thermal expansivity, fused silica (especially, spherical fused silica) is more preferably used.

In the case where the inorganic filler has a substantially spherical shape, an average particle size of the inorganic filler is not limited to a specific value, but is preferably in the range of 0.01 to 5.0 μm, and more preferably in the range of 0.2 to 2.0 μm.

An amount of the inorganic filler contained in the surface layer 5 is not limited to a specific value, but is preferably in the range of 5 to 40 wt %, and more preferably in the range of 10 to 30 wt %. By setting the amount of the inorganic filler to a value within the above range, it is possible to impart a low-coefficient of thermal expansion to the surface layer 5 effectively. As a result, occurrence of warpage of the semiconductor element mounting board 10 can be reduced more effectively.

Further, the surface layer 5 preferably contains the same fiber member as described in the core board 1 in addition to the above components. This makes it possible to impart a low-coefficient of thermal expansion to the surface layer 5 effectively. As a result, occurrence of warpage of the semiconductor element mounting board 10 can be reduced more effectively.

The first layer 3 (second layer 4) is mainly composed of a resin material.

The resin material constituting the first layer 3 (second layer 4) is not limited to a specific one, as long as it has a high dielectric property. Examples of the resin material constituting the first layer 3 (second layer 4) include the resin material constituting the above mentioned surface layer 5.

By constituting the first layer 3 (second layer 4) from the resin material constituting the surface layer 5, it is possible to further improve adhesiveness between the first layer 3 (second layer 4) and the surface layer 5, thereby preventing delamination therebetween.

Further, the first layer 3 (second layer 4) can have a coefficient of thermal expansion close to that of copper which is a material constituting a conductive circuit provided between the first layer 3 (second layer 4) and the surface layer 5. Therefore, it is possible to reduce stress which would occur at an interface between the first layer 3 (second layer 4) and the conductive circuit constituted from the copper. This makes it possible to obtain an effect of maintaining an excellent electrical conductive property of the conductive circuit.

<Method of Manufacturing Semiconductor Element Mounting Board>

Next, description will be made on one example of a method of manufacturing the semiconductor element mounting board 10 described above.

FIGS. 2(a) to 2(d) are views showing one example of the method of manufacturing the semiconductor element mounting board 10.

Figure 2:
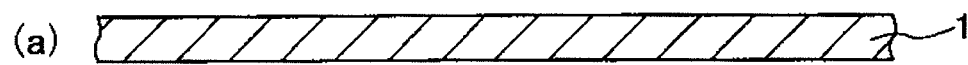
FIGS. 2(a) to 2(d) are views showing one example of a method of manufacturing a semiconductor element mounting board according to the present invention.
Figure 2:
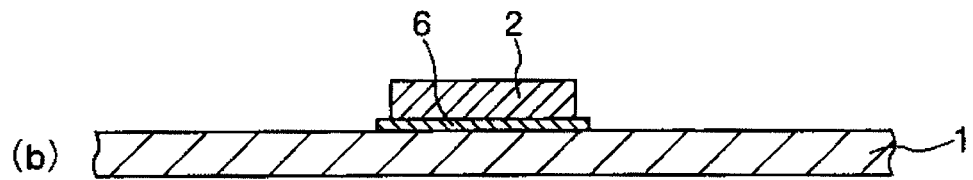
Figure 2:
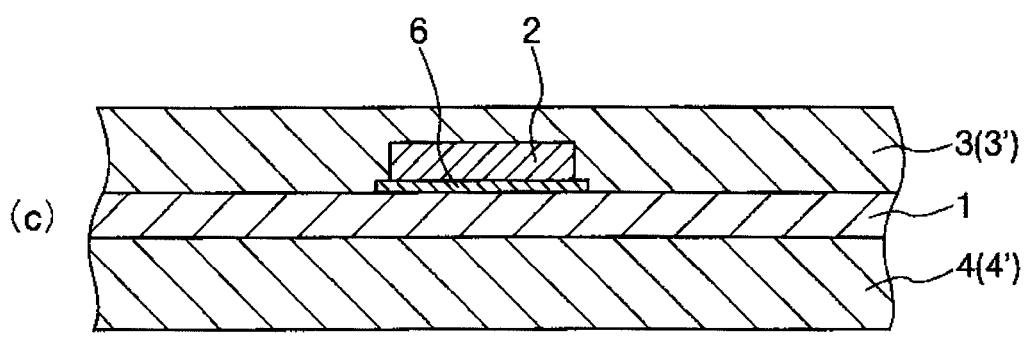
Figure 2:
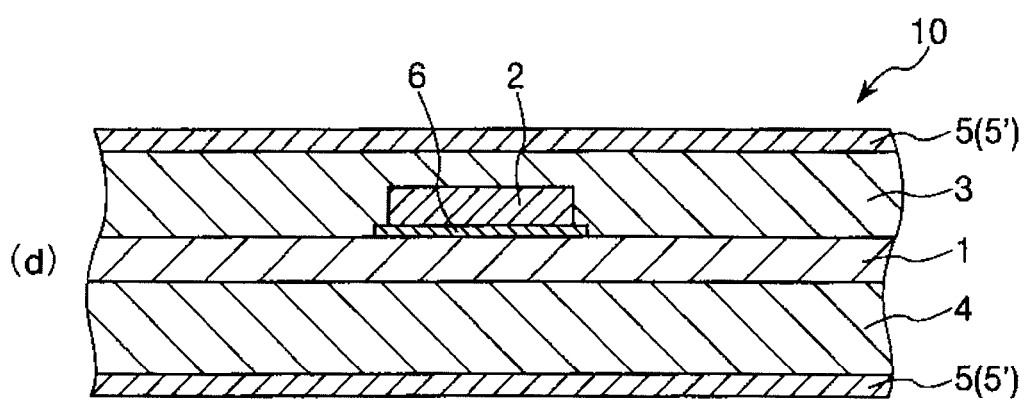

First, as shown in FIG. 2(a), the core board 1 is prepared.

Next, as shown in FIG. 2(b), the semiconductor element 2 is mounted on the core board 1 at a central portion thereof through the bonding film 6.

On the other hand, the material for forming each of the first layer 3 and the second layer 4 is formed in a sheet shape to prepare a dielectric sheet 3' and a dielectric sheet 4'.

Next, the dielectric sheet 3' is laminated on an upper surface of the core board 1 on which the semiconductor element 2 is mounted, and the dielectric sheet 4' is laminated on a lower surface of the core board 1 opposite to the upper surface.

Thereafter, the dielectric sheet 3' and the dielectric sheet 4' are cured to bring into the first layer 3 and the second layer 4 to thereby obtain an embedding type board in which the semiconductor element 2 is embedded into the first layer 3 (see FIG. 2(c)).

Further, the material for forming the surface layer 5 is formed in a sheet shape to prepare two dielectric sheets 5'.

Next, these dielectric sheets 5' are laminated on the first layer 3 and the second layer 4, respectively.

Thereafter, the dielectric sheets 5' are cured to bring into the surface layers 5 to thereby obtain a semiconductor element mounting board 10 (that is, the semiconductor element mounting board of the present invention) (see FIG. 2(d)).

Hereinabove, the semiconductor element mounting board of the present invention has been described, but is not limited thereto.

The semiconductor element mounting board in which one semiconductor element 2 is provided has been described in the above mentioned embodiment, but is not limited thereto. In the semiconductor element mounting board, two or more semiconductor elements may be provided.

The semiconductor element mounting board in which each surface layer is formed from a single layer has been described in the above mentioned embodiment, but is not limited thereto. In the semiconductor element mounting board, each surface layer may be formed from a multiple layer.

The method of forming the first layer, the second layer and the surface layer, respectively, using sheets constituted from the materials for forming the layers has been described in the above mentioned embodiment, but is not limited thereto. Each layer may be formed by applying a liquid containing the material for forming each layer.

EXAMPLES

Hereinbelow, the present invention will be described in detail based on the following Examples and Comparative Examples, but is not limited to these Examples.

<1> Raw Materials Used in Examples and Comparative Examples

Raw materials used in Examples and Comparative Examples are indicated below.

(1) Cyanate resin A: Novolak type cyanate resin having a weight-average molecular weight of 700 (product name of "Primaset PT-30" produced by LONZA Japan)

(2) Cyanate resin B: Novolak type cyanate resin having a weight-average molecular weight of 2,600 (product name of "Primaset PT-60" produced by LONZA Japan)

(3) Epoxy resin: Biphenyl dimethylene type epoxy resin having an epoxy equivalent of 275 and a weight-average molecular weight of 2,000 (product name of "NC-3000" produced by Nippon Kayaku Co., Ltd.)

(4) Phenoxy resin A: Copolymer of biphenyl epoxy resin and bisphenol S epoxy resin having an epoxy group at an end thereof and a weight-average molecular weight of 30,000 (product name of "YX-8100H30" produced by Japan Epoxy Resin Co. Ltd.)

(5) Phenoxy resin B: Copolymer of bisphenol A type epoxy resin and bisphenol F type epoxy resin having an epoxy group at an end thereof and a weight-average molecular weight of 60,000 (product name of "Epicoat 4275" produced by Japan Epoxy Resin Co. Led.)

(6) Curing catalyst: Imidazole compound (product name of "2-phenyl-4,5-dihydroxy methyl imidazole" produced by SHIKOKU CHEMICALS CORPORATION)

(7) Inorganic filler: Spherical fused silica having an average particle size of 0.5 μm (product name of "SO-25H" produced by Admatechs Co., Ltd.)

(8) Coupling agent: Epoxy silane coupling agent (product name of "A-187" produced by Nippon Unicar Company Limited)

<2> Manufacture of Semiconductor Element Mounting Board

Example 1

[1] Preparation of Resin Varnish 15 parts by weight of the cyanate resin A, 10 parts by weight of the cyanate resin B, 25 parts by weight of the epoxy resin, 5 parts by weight of the phenoxy resin A, 5 parts by weight of the phenoxy resin B and 0.4 parts by weight of the curing catalyst were dissolved and dispersed into methyl ethyl ketone.

In addition, 40 parts by weight of the inorganic filler and 0.2 parts by weight of the coupling agent were added to the methyl ethyl ketone. Thereafter, they were stirred using a high speed stirring machine for 10 minutes to thereby prepare a resin varnish containing a solid content in an amount of 50 wt %.

[2] Preparation of Dielectric Sheet a with Base Member

A plurality of dielectric sheets A with base members were prepared. Each dielectric sheet A with base member was prepared as follows.

The resin varnish obtained in the above manner was supplied on one surface of a polyethylene terephthalate (PET) film having a thickness of 38 μm using a comma coater, and then dried using a drier at 160° C. for 10 minutes to thereby obtain a dielectric sheet A with base member. In this regard, it is to be noted that the obtained dielectric sheet A had a thickness of 80 μm.

[3] Preparation of Dielectric Sheet B with Base Member

A plurality of dielectric sheets B with base members were prepared. Each dielectric sheet B with base member was prepared as follows.

The resin varnish obtained in the above manner was impregnated into a glass woven cloth having a thickness of 28 μm ("WEA-1035" produced by Nitto Boseki Co., Ltd.), and then dried using a furnace at 120° C. for 2 minutes. In this way, a prepreg including a varnish solid content (that is, the resins and the silica contained in the prepreg) in an amount of about 50 wt % was obtained.

This prepreg was bonded to one surface of a polyethylene terephthalate (PET) film having a thickness of 38 μm using a laminator, and then dried using a drier at 160° C. for 10 minutes to thereby obtain a dielectric sheet B with base member. In this regard, it is to be noted that the obtained dielectric sheet B had a thickness of 80 μm.

[4] Preparation of Dielectric Sheet D with Base Member

A plurality of dielectric sheets D with base members were prepared. Each dielectric sheet D with base member was prepared as follows.

The resin varnish obtained in the above manner was impregnated into a glass woven cloth having a thickness of 28 μm ("WEA-1035" produced by Nitto Boseki Co., Ltd.), and then dried using a furnace at 120° C. for 2 minutes. In this way, a prepreg including a varnish solid content (that is, the resins and the silica contained in the prepreg) in an amount of about 50 wt % was obtained.

This prepreg was bonded to one surface of a polyethylene terephthalate (PET) film having a thickness of 38 μm using a laminator, and then dried using a drier at 160° C. for 10 minutes to thereby obtain a dielectric sheet D with base member. In this regard, it is to be noted that the obtained dielectric sheet D had a thickness of 80 μm.

[5] Manufacture of Semiconductor Element Mounting Board

Copper foils of a double-sided copper-clad laminated board ("ELC-4785GS" produced by Sumitomo Bakelite Co., Ltd.) were processed (removed) by subjecting them to an etching treatment to thereby obtained a core board having a thickness of 100 µm and a size of 40 mm square.

Next, a semiconductor element (chip) having a thickness of 75 µm and a size of 8 mm square was bonded to the core board at a central portion thereof using a sheet-shaped adhesive agent having a thickness of 25 µm by heating and pressing them at a temperature of 130° C.

Next, the dielectric sheets A with base members were laminated on the core board so that the dielectric sheets A made contact with both a surface of the core board on which the semiconductor element was mounted and a surface thereof on which the semiconductor element was not mounted. Thereafter, the dielectric sheets A were shaped using a vacuum press type laminator at a pressure of 0.8 MPa, at a temperature of 100° C. for a time of 30 seconds.

Next, the dielectric sheets A were heated and cured using a hot-air dryer at a temperature of 170° C. for a time of 45 minutes, and then the base members were, respectively, peeled off and removed from the dielectric sheets A. In this way, an embedding board into which the semiconductor element was embedded was obtained. Namely, a first layer and a second layer were formed on the core board, respectively.

Next, the dielectric sheets B with base members obtained in the above manner were laminated on the first layer and the second layer so that the dielectric sheets B made contact with both the layers, respectively. Thereafter, the dielectric sheets B were shaped using a vacuum press type laminator at a pressure of 0.8 MPa, at a temperature of 80° C. for a time of 30 seconds.

Next, the dielectric sheets B were heated and cured using a hot-air dryer at a temperature of 180° C. for a time of 45 minutes, the base members were, respectively, peeled off and removed from the dielectric sheets B, and then the dielectric sheets B were heated and cured using the hot-air dryer at a temperature of 200° C. for a time of 60 minutes. In this way, a semiconductor element mounting board for evaluation was obtained.

Example 2

First, a semiconductor element was mounted on a core board in the same manner as in Example 1. Next, commercial dielectric sheets C with base members (product name of "ABF-GX13" produced by Ajinomoto Fine Chemical Co., Ltd.) were laminated on the core board so that the dielectric sheets C made contact with both a surface of the core board on which the semiconductor element was mounted and a surface thereof on which the semiconductor element was not mounted. Thereafter, the dielectric sheets C were shaped using a vacuum press type laminator at a pressure of 1.0 MPa, at a temperature of 105° C. for a time of 30 seconds.

Next, the base members were, respectively, peeled off and removed from the dielectric sheets C, and then the dielectric sheets C were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, the dielectric sheets B with base members obtained in the same manner as in Example 1 were laminated on the first layer and the second layer so that the dielectric sheets B made contact with both the layers, respectively. Thereafter, the dielectric sheets B were shaped using a vacuum press type laminator at a pressure of 0.8 MPa, at a temperature of 80° C. for a time of 30 seconds.

Next, the dielectric sheets B were heated and cured using a hot-air dryer at a temperature of 180° C. for a time of 45 minutes, the base members were, respectively, peeled off and removed from the dielectric sheets B, and then the dielectric sheets B were heated and cured at a temperature of 200° C. for a time of 60 minutes. In this way, a semiconductor element mounting board for evaluation was obtained.

Example 3

First, a semiconductor element was mounted on a core board in the same manner as in Example 1. Next, the dielectric sheets B with base members were laminated on the core board so that the dielectric sheets B made contact with both a surface of the core board on which the semiconductor element was mounted and a surface thereof on which the semiconductor element was not mounted. Thereafter, the dielectric sheets B were shaped using a vacuum press type laminator at a pressure of 0.8 MPa, at a temperature of 100° C. for a time of 30 seconds.

Next, the dielectric sheets B were heated and cured using a hot-air dryer at a temperature of 170° C. for a time of 45 minutes, and then the base members were, respectively, peeled off and removed from the dielectric sheets B. In this way, an embedding board into which the semiconductor element was embedded was obtained. Namely, a first layer and a second layer were formed on the core board, respectively.

Next, the dielectric sheets D with base members obtained in the same manner as in Example 1 were laminated on the first layer and the second layer so that the dielectric sheets D made contact with both the layers, respectively. Thereafter, the dielectric sheets D were shaped using a vacuum press type laminator at a pressure of 0.8 MPa, at a temperature of 80° C. for a time of 30 seconds.

Next, the dielectric sheets D were heated and cured using a hot-air dryer at a temperature of 180° C. for a time of 45 minutes, the base members were, respectively, peeled off and removed from the dielectric sheets D, and then the dielectric sheets D were heated and cured using the hot-air dryer at a temperature of 200° C. for a time of 60 minutes. In this way, a semiconductor element mounting board for evaluation was obtained.

Example 4

First, a semiconductor element was mounted on a core board in the same manner as in Example 1. Next, commercial dielectric sheets C with base members (product name of "ABF-GX13" produced by Ajinomoto Fine Chemical Co., Ltd.) were laminated on the core board so that the dielectric sheets C made contact with both a surface of the core board on which the semiconductor element was mounted and a surface thereof on which the semiconductor element was not mounted. Thereafter, the dielectric sheets C were shaped using a vacuum press type laminator at a pressure of 1.0 MPa, at a temperature of 105° C. for a time of 30 seconds.

Next, the base members were, respectively, peeled off and removed from the dielectric sheets C, and then the dielectric sheets C were heated and cured using a hot-air dryer at a temperature of 180° C. for a time of 90 minutes. In this way, an embedding board into which the semiconductor element was embedded was obtained. Namely, a first layer and a second layer were formed on the core board, respectively.

Next, the dielectric sheets D with base members obtained in the same manner as in Example 1 were laminated on the first layer and the second layer so that the dielectric sheets D made contact with both the layers, respectively. Thereafter, the dielectric sheets D were shaped using a vacuum press type laminator at a pressure of 0.8 MPa, at a temperature of 80° C. for a time of 30 seconds.

Next, the dielectric sheets D were heated and cured using a hot-air dryer at a temperature of 180° C. for a time of 45 minutes, the base members were, respectively, peeled off and removed from the dielectric sheets D, and then the dielectric sheets D were heated and cured using the hot-air dryer at a temperature of 200° C. for a time of 60 minutes. In this way, a semiconductor element mounting board for evaluation was obtained.

Comparative Example 1

An embedding board into which the semiconductor element was embedded was obtained in the same manner as in Example 1.

Next, the dielectric sheets A with base members obtained in the above manner were laminated on the first layer and the second layer so that the dielectric sheets A made contact with both the layers, respectively. Thereafter, the dielectric sheets A were shaped using a vacuum press type laminator at a pressure of 0.8 MPa, at a temperature of 100° C. for a time of 30 seconds.

Next, the dielectric sheets A were heated and cured using a hot-air dryer at a temperature of 170° C. for a time of 45 minutes, the base members were, respectively, peeled off and removed from the dielectric sheets A, and then the dielectric sheets A were heated and cured using the hot-air dryer at a temperature of 200° C. for a time of 60 minutes. In this way, a semiconductor element mounting board for evaluation was obtained.

Comparative Example 2

An embedding board into which the semiconductor element was embedded was obtained in the same manner as in Example 2.

Next, commercial dielectric sheets C with base members (product name of "ABF-GX13" produced by Ajinomoto Fine Chemical Co., Ltd.) were laminated on the first layer and the second layer so that the dielectric sheets C made contact with both the layers, respectively. Thereafter, the dielectric sheets C were shaped using a vacuum press type laminator at a pressure of 1.0 MPa, at a temperature of 105° C. for a time of 30 seconds.

Next, the base members were, respectively, peeled off and removed from the dielectric sheets C, and then the dielectric sheets C were heated and cured using a hot-air dryer at a temperature of 180° C. for a time of 90 minutes. In this way, a semiconductor element mounting board for evaluation was obtained.

A Young's modulus, a coefficient of linear expansion (coefficient of thermal expansion) and a glass-transition temperature of each of the surface layer and the first layer (second layer) of the semiconductor element mounting board obtained in each of Examples and Comparative Examples were measured. These results are shown in Table 1.

Further, a Young's modulus, a coefficient of linear expansion (coefficient of thermal expansion) and a glass-transition temperature of the core board of the semiconductor element mounting board obtained in each of Examples and Comparative Examples are also shown in Table 1.

Young's Modulus

Two dielectric sheets with the base members used for forming each of the surface layer and the first layer (second layer) of the semiconductor element mounting board obtained in each of Examples and Comparative Examples were laminated on each other so that the dielectric sheets made contact with each other. Thereafter, the dielectric sheets were shaped using a vacuum presser at a pressure of 2 MPa, at a temperature of 200° C. for a time of 2 hours.

Next, the base members were, respectively, peeled off and removed from the dielectric sheets to thereby obtain a dielectric sheet cured product. An evaluation sample having a size of 8 mm×35 mm was collected from the dielectric sheet cured product, and then a Young's modulus of the evaluation sample at 25° C. was measured using a DMA machine ("DMA 2980" produced by TA Instrument) under predetermined conditions (measurement mode: tension mode, measurement length: 20 mm, temperature rising rate: 5° C./min, measurement temperature range: 0 to 350° C., frequency: 1 Hz).

Coefficient of Linear Expansion (Coefficient of Thermal Expansion)

Two dielectric sheets with the base members used for forming each of the surface layer and the first layer (second layer) of the semiconductor element mounting board obtained in each of Examples and Comparative Examples were laminated on each other so that the dielectric sheets made contact with each other. Thereafter, the dielectric sheets were shaped using a vacuum presser at a pressure of 2 MPa, at a temperature of 200° C. for a time of 2 hours.

Next, the base members were, respectively, peeled off and removed from the dielectric sheets to thereby obtain a dielectric sheet cured product. An evaluation sample having a size of 4 mm×20 mm was collected from the dielectric sheet cured product, and then a coefficient of thermal expansion of the evaluation sample in an inplane direction thereof was measured using a TMA machine ("TMA 2940" produced by TA Instrument) under predetermined conditions (measurement mode: tension mode, measurement length: 20 mm, temperature rising rate: 10° C./min, measurement temperature range: 0 to 300° C., measurement load: 5 gf).

A coefficient of thermal expansion of the evaluation sample in a thickness direction thereof was measured by changing the measurement mode to a compression mode.

Glass-Transition Temperature

Two dielectric sheets with the base members used for forming each of the surface layer and the first layer (second layer) of the semiconductor element mounting board obtained in each of Examples and Comparative Examples were laminated on each other so that the dielectric sheets made contact with each other. Thereafter, the dielectric sheets were shaped using a vacuum presser at a pressure of 2 MPa, at a temperature of 200° C. for a time of 2 hours.

Next, the base members were, respectively, peeled off and removed from the dielectric sheets to thereby obtain a dielectric sheet cured product. An evaluation sample having a size of 10 mm×30 mm was collected (cut off) from the dielectric sheet cured product, and then heated using a DMA machine ("DMA 2980" produced by TA Instrument) under predetermined conditions (measurement mode: tension mode, measurement length: 20 mm, temperature rising rate: 5° C./min, measurement temperature range: 0 to 350° C., frequency: 1 Hz). A glass-transition temperature of the evaluation sample was defined as a peak value of tan δ.

<3> Evaluation of Semiconductor Element Mounting Board 10 semiconductor element mounting boards obtained in each of Examples and Comparative Examples were subjected to a thermal cycle test. By using this thermal cycle test, it was confirmed whether or not the semiconductor element was protected. Specifically, in the thermal cycle test, each semiconductor element mounting board was treated by repeating 3,000 thermal cycles each consisting of cooling at −65° C. and heating at 150° C. Thereafter, a comparative evaluation of the results confirmed in the semiconductor element mounting boards of Examples and Comparative Examples was carried out.

After treatment of the thermal cycle test, the semiconductor element mounting boards were cut off, and then sections thereof were checked. As a result, a semiconductor element mounting board in which cracks in the mounted semiconductor element, delamination of an interface between the mounted semiconductor element and the first layer and delamination of an interface between the mounted semiconductor element and the core board did not occur was defined as a good-quality article, and the number of the good-quality article was counted. These results are shown in Table 2.

Further, warpage amounts of a surface portion of the semiconductor element mounting board were measured in a cooling state (at −55° C.) and a heating state (at 150° C.) thereof during the thermal cycle test, and warpage amounts of the surface portion of the semiconductor element mounting board were measured in a room temperature state (at 25° C.) and a heating state (at a peak temperature of 260° C.) thereof during an IR reflow treatment, and then a variation value between the warpage amounts in each of the thermal cycle test and the IR reflow treatment was obtained. These results are also shown in Table 2.

As shown in Table 2, in each of the semiconductor mounting boards of the present invention obtained in Examples, occurrence of cracks in the semiconductor element and delamination of the semiconductor element from the core board due to change of an external environment was prevented, and occurrence of warpage thereof was also reduced. In contrast, in each of the semiconductor mounting boards obtained in Comparative Examples, sufficient results could not be obtained.

INDUSTRIAL APPLICABILITY

According to the present invention, it is possible to provide a semiconductor element mounting board which can reduce occurrence of warpage thereof due to change of an external environment and prevent delamination of a semiconductor element embedded therein from a core board. Thus, the present invention has industrial applicability.

What is claimed is:
1. A semiconductor element mounting board, comprising:
a board having surfaces;
a semiconductor element mounted on one of the surfaces of the board;
a first layer into which the semiconductor element is embedded, the first layer being provided on the one surface of the board;
a second layer provided on the other surface of the board, the second layer being constituted from the same material as that of the first layer, the constituent material of the second layer having the same composition ratio as that of the constituent material of the first layer; and
surface layers provided on the first and second layers, respectively, each of the surface layers being formed from at least a single layer,
wherein each of the surface layers has rigidity higher than that of each of the first and second layers, and
wherein a glass-transition temperature $Tg_\alpha$ of the surface layers, which is measured based on JIS C 6481, is in the range of 100 to 300° C.

2. The semiconductor element mounting board as claimed in claim 1, wherein in the case where a Young's modulus of each surface layer at 25° C. is defined as X GPa and a Young's modulus of the first layer at 25° C. is defined as Y GPa, the X and the Y satisfy a relation of $0.5 \leq X-Y \leq 13$.

3. The semiconductor element mounting board as claimed in claim 2, wherein the Young's modulus of each surface layer at 25° C. is in the range of 4 to 15 GPa.

TABLE 1

|  | Average thickness [μm] | Young's modulus [GPa] | Coefficient of thermal expansion [ppm/° C.] | | Glass-transition temperature [° C.] |
|---|---|---|---|---|---|
|  |  |  | Inplane direction | Thickness direction |  |
| Surface layer | | | | | |
| Ex. 1 | 80 | 12 | 16 | 25 | 250 |
| Ex. 2 | 80 | 12 | 16 | 25 | 250 |
| Ex. 3 | 80 | 14 | 11 | 25 | 250 |
| Ex. 4 | 80 | 14 | 11 | 25 | 250 |
| Comp. Ex. 1 | 80 | 12 | 16 | 25 | 250 |
| Comp. Ex. 2 | 80 | 4 | 46 | 46 | 190 |
| First layer (Second layer) | | | | | |
| Ex. 1 | 80 | 5 | 30 | 30 | 240 |
| Ex. 2 | 80 | 4 | 46 | 46 | 190 |
| Ex. 3 | 80 | 12 | 16 | 25 | 250 |
| Ex. 4 | 80 | 4 | 46 | 46 | 190 |
| Comp. Ex. 1 | 80 | 12 | 16 | 25 | 250 |
| Comp. Ex. 2 | 80 | 4 | 46 | 46 | 190 |
| Core board | | | | | |
| Ex. 1 | 100 | 29 | 11 | 16 | 265 |
| Ex. 2 | 100 | 29 | 11 | 16 | 265 |
| Ex. 3 | 100 | 29 | 11 | 16 | 265 |
| Ex. 4 | 100 | 29 | 11 | 16 | 265 |
| Comp. Ex. 1 | 100 | 29 | 11 | 16 | 265 |
| Comp. Ex. 2 | 100 | 29 | 11 | 16 | 265 |

TABLE 2

|  | Number of good-quality article after treatment of thermal cycle test | | Evaluation of warpage | |
|---|---|---|---|---|
|  |  |  | Variation value between cooling state (at −65° C.) and heating state (at 150° C.) during thermal cycle test [μm] | Variation value between room temperature state (at 25° C.) and heating state (at peak temperature of 260° C.) during IR reflow treatment [μm] |
|  | After treatment of 1000 cycles | After treatment of 3000 cycles | | |
| Ex. 1 | 10 | 10 | 188.0 | 100.1 |
| Ex. 2 | 10 | 10 | 195.5 | 127.1 |
| Ex. 3 | 10 | 10 | 176.5 | 96.1 |
| Ex. 4 | 10 | 10 | 180.1 | 119.0 |
| Comp. Ex. 1 | 10 | 8 | 254.6 | 175.1 |
| Comp. Ex. 2 | 5 | 0 | 281.8 | 263.6 |

4. The semiconductor element mounting board as claimed in claim 2, wherein the Young's modulus of the first layer at 25° C. is in the range of 2 to 10 GPa.

5. The semiconductor element mounting board as claimed in claim 1, wherein in the case where a coefficient of thermal expansion of each surface layer in an inplane direction thereof measured based on JIS C 6481 at a temperature of 20° C. to a glass-transition temperature $Tg_a$° C. thereof, which is measured based on JIS C 6481, is defined as A ppm/° C. and a coefficient of thermal expansion of the first layer in an inplane direction thereof measured based on JIS C 6481 at a temperature of 20° C. to a glass-transition temperature $Tg_b$° C. thereof, which is measured based on JIS C 6481, is defined as B ppm/° C., the A and the B satisfy a relation of $0.5 \leq B-A \leq 50$.

6. The semiconductor element mounting board as claimed in claim 5, wherein the coefficient of thermal expansion of each surface layer in the inplane direction thereof measured based on JIS C 6481 at the temperature of 20° C. to the glass-transition temperature $Tg_a$° C., which is measured based on JIS C 6481, is 40 ppm/° C. or lower.

7. The semiconductor element mounting board as claimed in claim 5, wherein the coefficient of thermal expansion of the first layer in the inplane direction thereof measured based on JIS C 6481 at the temperature of 20° C. to the glass-transition temperature $Tg_b$° C., which is measured based on JIS C 6481, is in the range of 25 to 50 ppm/° C.

8. The semiconductor element mounting board as claimed in claim 1, wherein a glass-transition temperature $Tg_b$ of the first layer, which is measured based on JIS C 6481, is in the range of 100 to 250° C.

9. The semiconductor element mounting board as claimed in claim 1, wherein a Young's modulus of the board at 25° C. is in the range of 20 to 50 GPa.

10. The semiconductor element mounting board as claimed in claim 1, wherein a coefficient of thermal expansion of the board in an inplane direction thereof measured based on JIS C 6481 at a temperature of 20° C. to a glass-transition temperature $Tg_c$° C. thereof, which is measured based on JIS C 6481, is 13 ppm/° C. or lower.

11. The semiconductor element mounting board as claimed in claim 1, wherein the semiconductor element is mounted on the board through a film.

12. The semiconductor element mounting board as claimed in claim 1, wherein each surface layer is mainly composed of a resin material containing cyanate resin and an inorganic filler.

13. The semiconductor element mounting board as claimed in claim 12, wherein an amount of the resin material contained in each surface layer is in the range of 30 to 70 wt %.

14. The semiconductor element mounting board as claimed in claim 12, wherein an amount of the inorganic filler contained in each surface layer is in the range of 5 to 40 wt %.

15. The semiconductor element mounting board as claimed in claim 12,
wherein the resin material further contains epoxy resin, and
wherein in the case where an amount of the cyanate resin contained in the resin material is defined as C wt % and an amount of the epoxy resin contained in the resin material is defined as D wt %, the C and the D satisfy a relation of $0.5 \leq D/C \leq 4$.

16. The semiconductor element mounting board as claimed in claim 12,
wherein the resin material further contains phenoxy resin, and
wherein in the case where an amount of the cyanate resin contained in the resin material is defined as C wt % and an amount of the phenoxy resin contained in the resin material is defined as E wt %, the C and the E satisfy a relation of $0.2 \leq E/C \leq 2$.

* * * * *